United States Patent [19]  
Chung et al.

[11] Patent Number: 4,649,516  
[45] Date of Patent: Mar. 10, 1987

[54] DYNAMIC ROW BUFFER CIRCUIT FOR DRAM

[75] Inventors: Paul W. Chung, San Jose, Calif.; Richard E. Matick, Peekskill; Daniel T. Ling, Croton-on-Hudson, both of N.Y.

[73] Assignee: International Business Machines Corp., Armonk, N.Y.

[21] Appl. No.: 616,045

[22] Filed: Jun. 1, 1984

[51] Int. Cl.$^4$ .................... G06F 12/00; G06F 13/38
[52] U.S. Cl. .................................................. 364/900
[58] Field of Search ............... 364/900 MS File; 365/189, 235; 307/272 A, 291; 377/81

[56] References Cited

U.S. PATENT DOCUMENTS

| | | | |
|---|---|---|---|
| 3,969,706 | 7/1976 | Proebsting et al. | 365/189 X |
| 4,356,411 | 10/1982 | Suzuki et al. | 307/272 A |
| 4,359,647 | 11/1982 | Trinkl | 307/291 X |
| 4,386,282 | 5/1983 | Scavuzzo | 377/81 |
| 4,422,160 | 12/1983 | Watanabe | 365/235 X |

Primary Examiner—James R. Hoffman  
Attorney, Agent, or Firm—C. Lamont Whitham

[57] ABSTRACT

A dynamic row buffer circuit is disclosed for a dynamic random access memory (DRAM) chip which enables the DRAM chip to be used for special function applications. The dynamic row buffer comprises a row buffer master register and a row buffer slave register. The row buffer master register comprises a plurality of master circuits (M1) and a plurality of slave circuits (S1). Likewise, the row buffer slave register comprises a plurality of master circuits (M2) and a plurality of slave circuits (S2). The row buffer master register is parallel load and parallel read-out with the outputs of the master register slave circuits being connected to the master circuits of the slave register. The row buffer slave register is a parallel load, serial read-out register with the output being shifted out of a secondary output port. The entire row buffer can be isolated from the memory array, and when so isolated, the memory array can be accessed through the primary input/output port in the same way as in an ordinary DRAM chip. This arrangement permits the conversion of a DRAM chip to a dual port display, of which a specific example is disclosed, or some other special function RAM thereby adding a large value to the DRAM chip with little additional cost.

14 Claims, 11 Drawing Figures

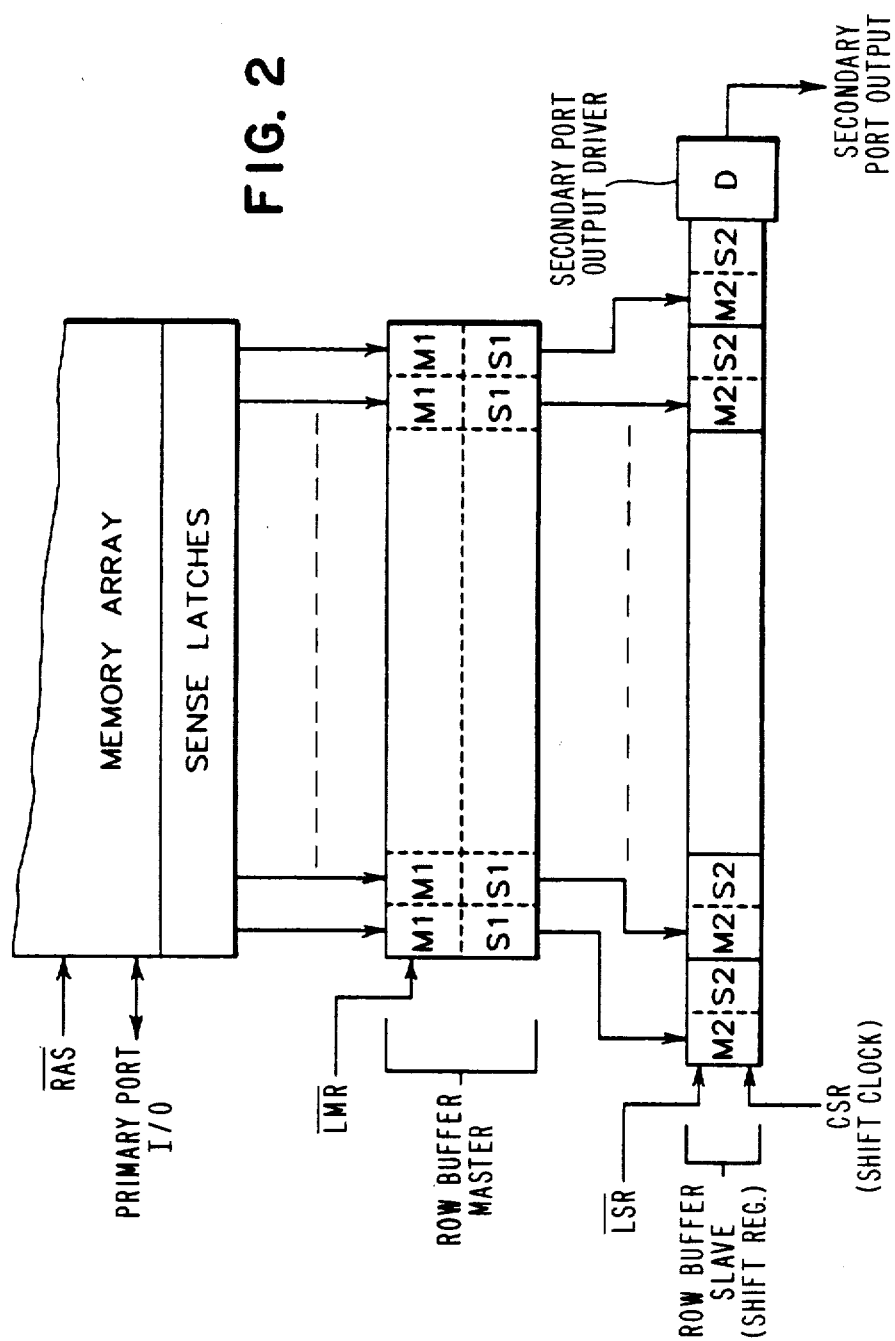

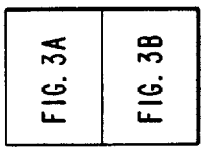
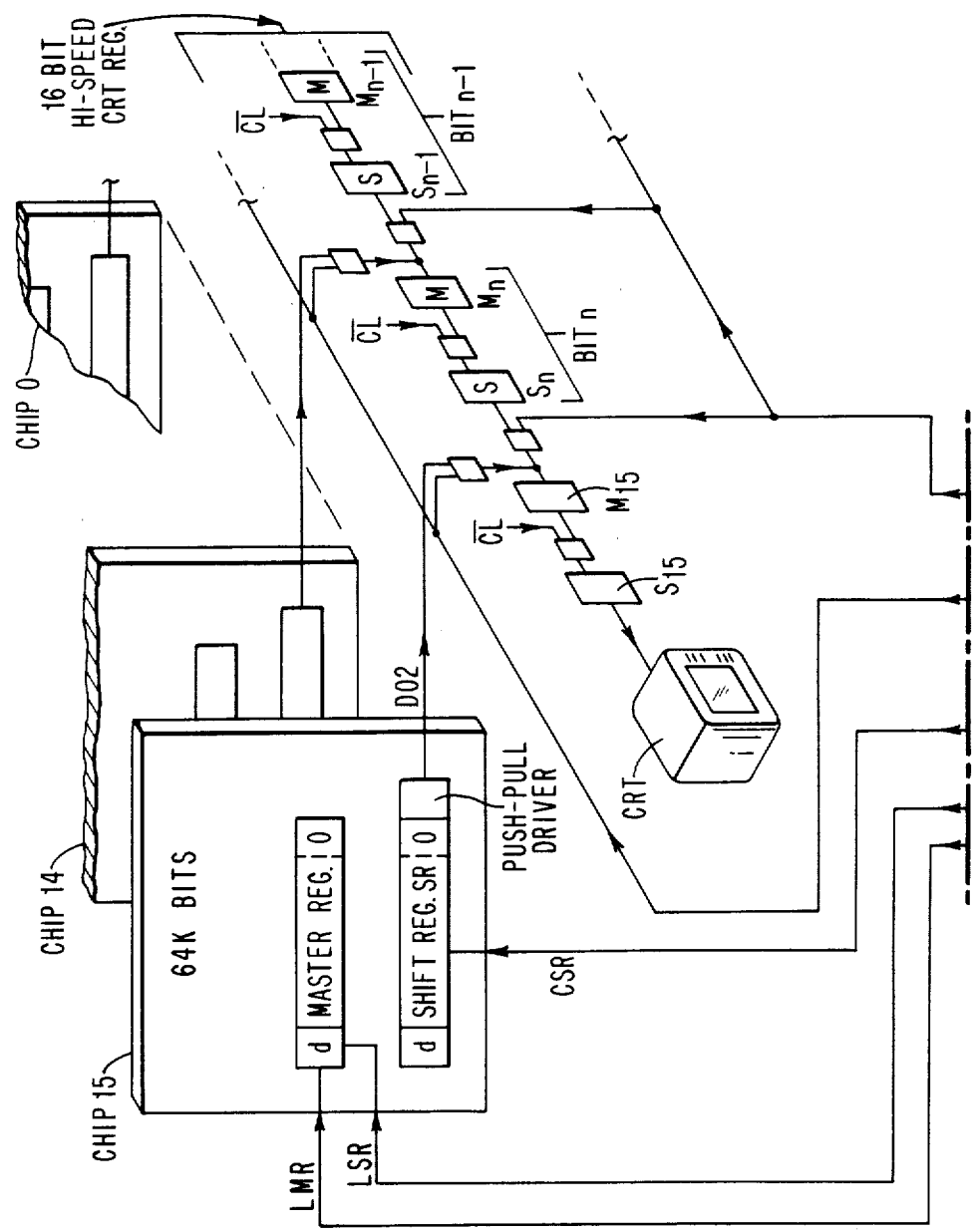
FIG. 3A

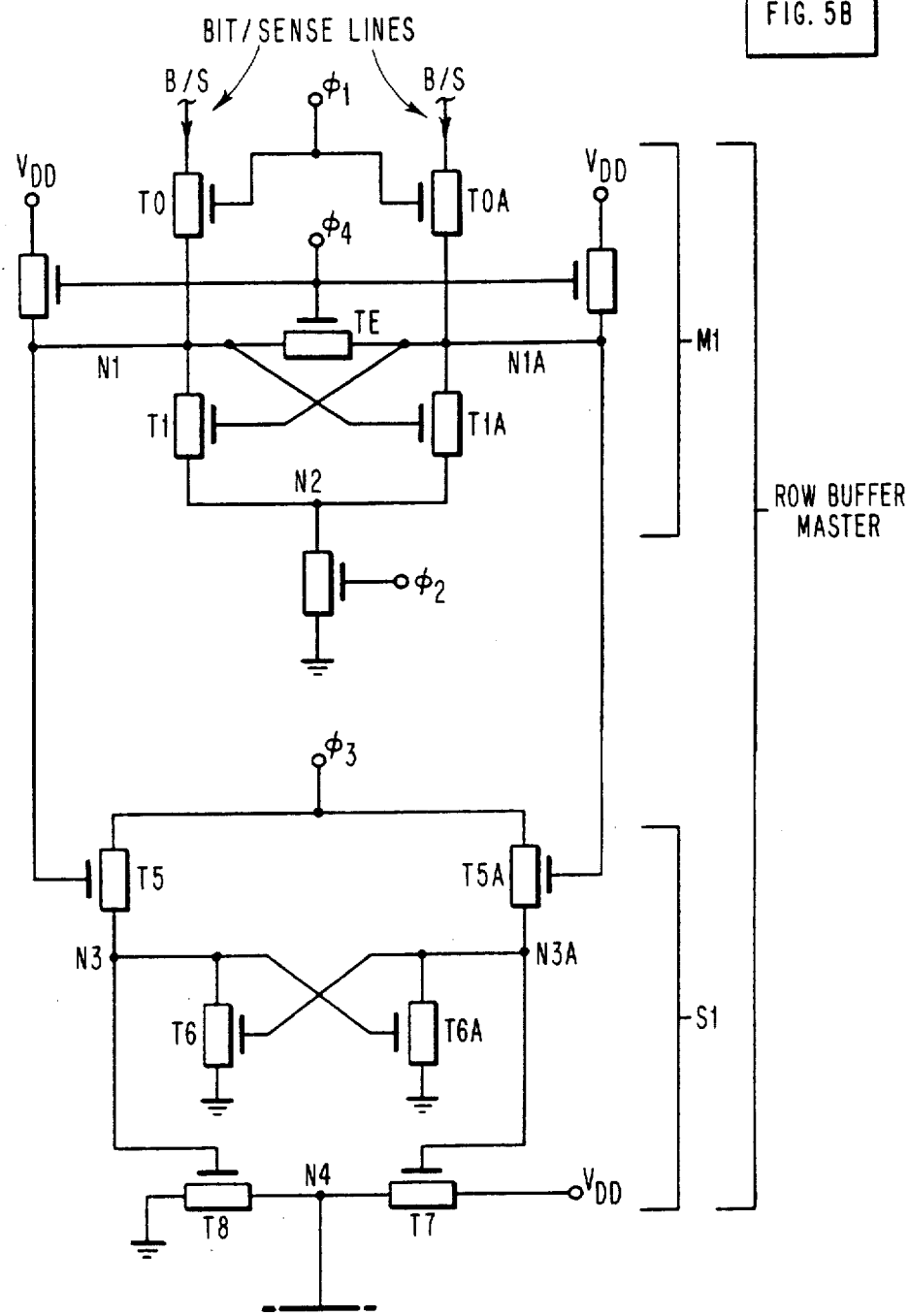

DYNAMIC ROW BUFFER CIRCUIT FOR DRAM

CROSS-REFERENCE TO RELATED APPLICATIONS

The subject matter of this application has utility in the systems disclosed in the following copending applications: "Circuits for Accessing a Variable Width Data Bus With a Variable Width Data Field", Ser. No. 06/394,044 filed June 30, 1982, by F. H. Dill, D. T. Ling, R. E. Matick, and D. J. McBride; and "Display Architecture Having Variable Data Width", Ser. No. 616,047, filed June 1, 1984, by R. E. Matick, D. T. Ling, and F. H. Dill. This invention is also related in subject matter to the invention disclosed in an application entitled "Random Access Memory Having a Second Input-/Output Port", Ser. No. 06/393,996 filed June 30, 1982, by F. H. Dill, now U.S. Pat. No. 4,541,075.

FIELD OF THE INVENTION

This invention generally relates to dynamic random access memory (DRAM) circuits, and more particularly to a fully dynamic row buffer circuit for a DRAM chip which enables the DRAM chip to be used for special function applications with minimum design effort, chip area requirements and power consumption.

BACKGROUND OF THE INVENTION

DRAM chips are well known in the art. One example is disclosed by Robert J. Proebsting and Robert S. Green in U.S. Pat. No. 3,969,706. This patent discloses a MISFET dynamic RAM chip wherein information from an address row are read and transferred to a column register. One bit in the column register is then selected by the column address decoder so that data is transferred from that bit to a data output latch. Upon completion of the row address strobe cycle, each cell in the address row is automatically refreshed by the data in respective bit positions of the column register. The state of the data output latch remains valid until a subsequent column address strobe is received. Read, write and read-modify-write cycles are supported. The entire system is substantially dynamic in operation which results in very low power consumption characteristic of DRAMs.

U.S. Pat. No. 4,422,160 to Hiroshi Watanabe discloses a memory device comprising an array of memory cells, a row decoder, a column decoder, and a shift register in parallel with the column decoder. Shift operation of the shift register is effected at each time the column strobe signal $\overline{CAS}$ is active during the active level state of the row address strobe signal $\overline{RAS}$. The Watanabe memory device provides both high-speed operation and low power consumption.

Also known in the art are shift register circuits having each stage comprised of a master circuit and a slave circuit. One example is disclosed by Robert J. Scavuzzo in U.S. Pat. No. 4,386,282. This patent discloses emitter function logic (EFL) shift register circuits having right and left shift capability, asynchronous set and clear, and asynchronous parallel load capability. Other examples of master/slave circuits are disclosed in U.S. Pat. No. 4,359,647 to Wolfgang Trinkl and U.S. Pat. No. 4,356,411 to Yosoji Suzuki and Minoru Takada.

The above-referenced application Ser. No. 06/393,996 by F. H. Dill discloses a dynamic RAM (DRAM) having a second data transfer port which is provided to improve the efficiency of data transfer to and from the memory. Dill provides an internal row buffer register connected in parallel with the RAM sense amplifiers. When a row is addressed and a read transfer pulse is applied to the register, the row word transfer to the row buffer register is completed. A subsequent signal applied to the row buffer shift register will clock the contents of the register to a second input-/output port. One application for the Dill dynamic RAM is in a bit map display device wherein the second output port is used to supply the refresh data to a CRT display. The primary input/output port is then used to update the memory with new pixel data for later display without incurring delays from tying up the primary input/output port with refresh information for the display. Examples of such bit map displays are disclosed in applications Ser. No. 06/394,044 by F. H. Dill et al and Ser. No. 616,047, by R. E. Matick et al referenced above.

SUMMARY OF THE INVENTION

It is an object of this invention to provide an improved row buffer circuit for dynamic RAMs which allows a continuous, asynchronous data stream to be supplied to an output device.

It is another object of the invention to provide a row buffer circuit for a DRAM using master/slave technology which achieves superior isolation of the row buffer from the memory array.

The fully dynamic row buffer circuit according to the invention employs two independent registers called the row buffer master and the row buffer slave, where the latter is a parallel load, serial read-out register. The row buffer master register consists of its own master and slave circuit, and the row buffer slave consists of its own master and slave. The entire row buffer can be isolated from the memory array, and when so isolated, the memory array can be accessed through the primary I/O port in the same way as in an ordinary DRAM chip. The row buffer slave is driven by an asynchronous clock which can be changed on the fly to match the output device driven by the DRAM. This arrangement permits the conversion of a DRAM chip to a dual port display, printer or special function RAM thereby adding large value to the DRAM chip with little additional cost.

BRIEF DESCRIPTION OF THE DRAWINGS

The invention will be better understood from the following detailed description of the invention with reference to the drawings, in which:

FIG. 2 is a more detailed block diagram showing the organization of the row buffer master and the row buffer slave;

FIGS. 3A and 3B, taken together, as FIG. 3 are a block diagram illustrating a specific display application of the invention;

FIGS. 5A and 5B, taken together, are a schematic diagram of the row buffer master and the row buffer slave;

DETAILED DESCRIPTION OF THE INVENTION

Figure 1:
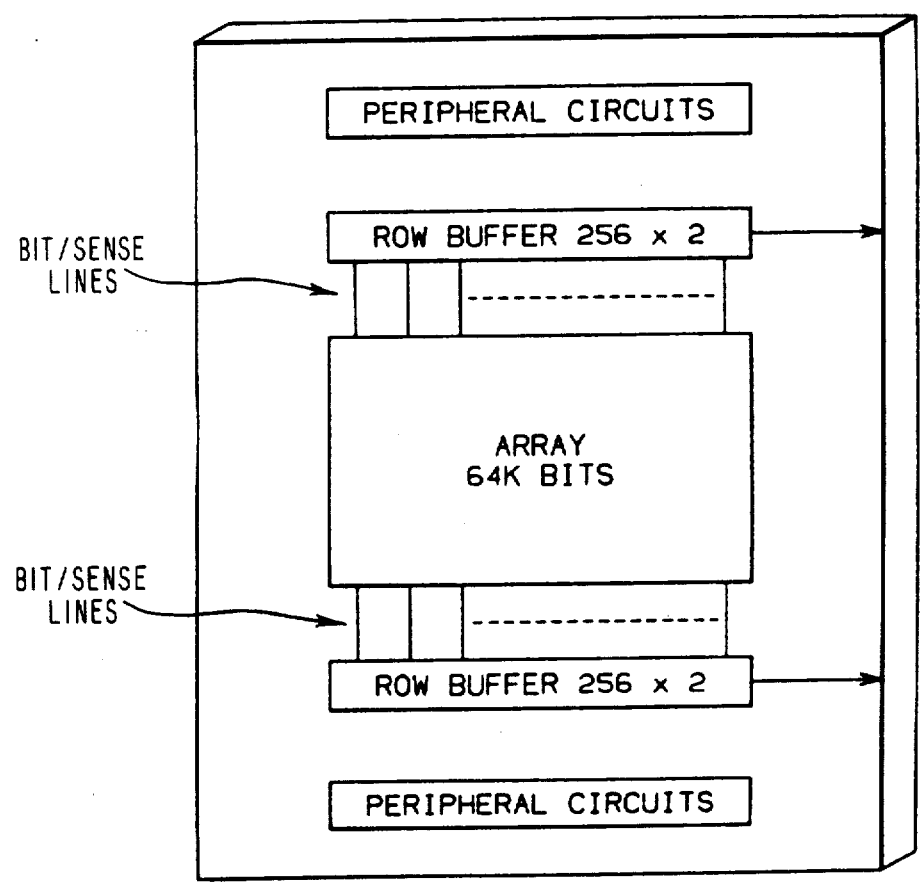
FIG. 1 is a generalized block diagram showing row buffers added to a 64K bit dynamic FET memory chip.

The fully dynamic row buffer circuit according to the invention can be added to a dynamic RAM chip generally as indicated in FIG. 1. The circuit can be used in existing RAM chips with a folded-bit line organization without affecting the array and sense amplifier portions of the chip. The buffer circuit is totally dynamic, small and acts as a temporary storage for the array data by controlling clocks.

The functional operation of the row buffer can be understood from the block diagram of FIG. 2. There are two independent registers called the row buffer master and the row buffer slave, where the latter is a parallel load, serial read-out register. Each of these registers is, in turn, composed of the necessary master/slave arrangement. For instance, the row buffer master register consists of its own master, M1, and slave, S1, circuits. Likewise, the row buffer slave consists of master, M2, and slave, S2, circuits. This entire row buffer can be isolated from the memory array. When the row buffer is isolated from the rest of the chip, the memory array can be accessed through the primary I/O port in the same way as in an ordinary dynamic RAM chip. There are three new control pins for the chip: Load Master Register ($\overline{LMR}$), Load Slave Register ($\overline{LSR}$), and Clock for shift Register (CSR). In order to load the row buffer master register, the chip address lines are made valid and the $\overline{LMR}$ and row address select ($\overline{RAS}$) pins are made active. This causes the data from the sense latches to be loaded into the master M1 registers. The operation is completed by deactivating $\overline{RAS}$. In order to transfer data from the row buffer master register into the slave register, LSR is made active together with CSR. This causes data to be transferred from M1 into S1 and then directly into M2 latches. When the $\overline{LSR}$ pin is deactivated, the data is then transferred into all S2 latches as well as the secondary port output driver on the right hand side of the row buffer slave in FIG. 2. In other words, $\overline{LSR}$ directly loads in parallel the data from the row buffer master into the row buffer slave shift register. This data is held here until either the serial shift signal CSR or a subsequent $\overline{LSR}$ is applied. A portion, or the entire contents of the shift register can be sequentially accessed at the secondary port by successive applications of CSR pulses. While this is taking place, the memory array can be accessed in the normal manner through the primary port, or the row buffer master can be reloaded with new data. With this arrangement of registers, a continuous stream of bits out of the secondary port can be achieved with no lost cycles. This capability is especially important for display applications but is also advantageous for printer and other applications. The shift clock CSR will normally be running continuously, shifiting bits out of the row buffer slave. A group of 512 bits is initially loaded and shifted. When the last bit reaches the output port, it is necessary to parallel load 512 new bits from the row buffer master into the slave such that the first bit of the second group falls immediately behind the last bit of the first group. The arrangement of FIG. 2 allows this as follows. When the last bit of the first group of 512 is being shifted into S2 of the right most bit position of the shift register, the second group of bits from M1 are loaded into the 512 positions of M2. Thus, the first bit of the second group will appear in S2 at the secondary output port on the very next cycle as desired.

Figure 3B:
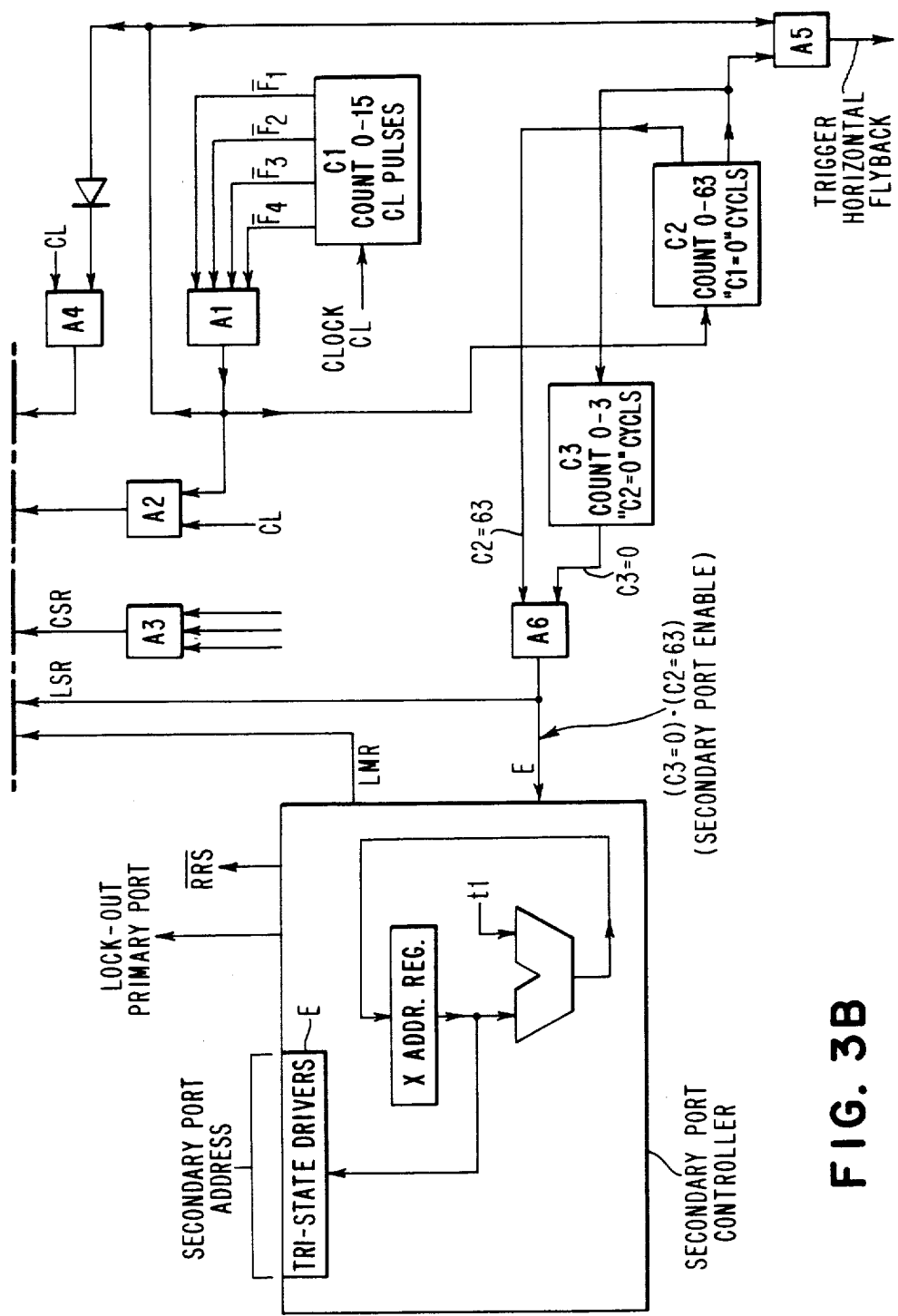

FIG. 3 illustrates a specific application of DRAMs provided with dynamic row buffers as shown in FIG. 2. In the application illustrated in FIG. 3, 16 64K DRAM chips are integrated into a cathode ray tube (CRT) display system. With the provision of a row buffer master register and a row buffer slave register, the master can be loaded at any time when a free memory cycle is available. Also, the slave can be loaded at any time during a reasonably wide window to avoid critical timing of these pel signals to the CRT screen. One fundamental point should be recognized concerning the timing relation between the primary and secondary ports. During loading of the row buffer master register, the primary and secondary ports must be synchronized, i.e. $\overline{LMR}$ must be synchronized to $\overline{RAS}$. However, once the master is loaded, the primary and secondary ports are completely independent of each other and run on different clocks.

Figure 4:
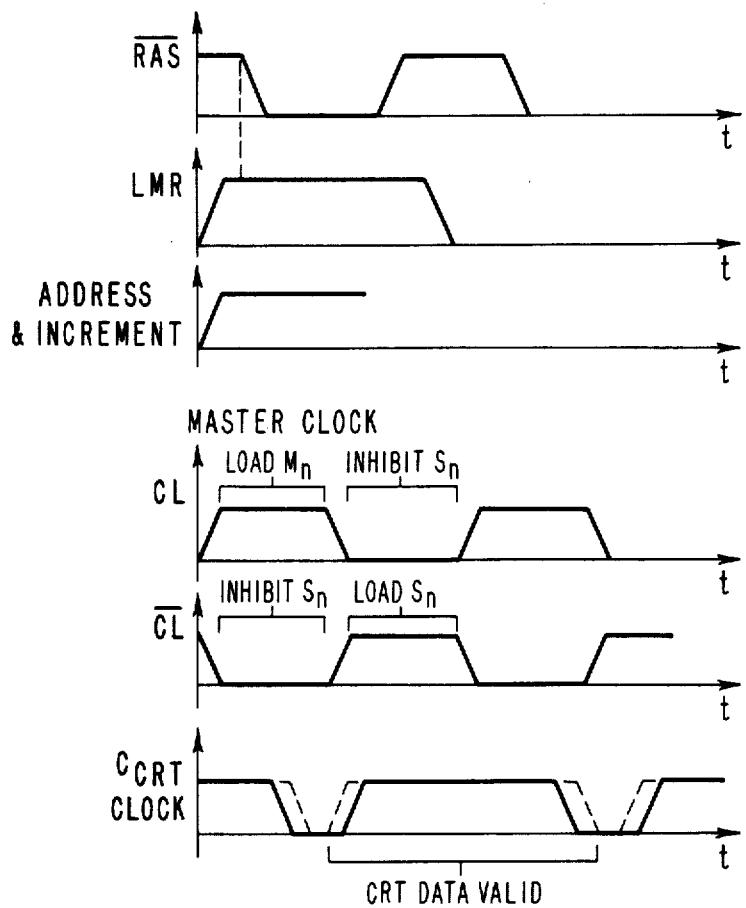
FIG. 4 is a timing diagram for the operation of the display application illustrated FIG. 3.

In FIG. 3, it is assumed that the screen is 1024 by 1024 pels and the bit buffer is composed of the 16 DRAM chips. Assuming each DRAM chip is a 64K chip, the dynamic row buffer is a 256 bit buffer. The peripheral counters, registers and logic are assumed to be TTL-like, with loading of requested slaves from masters occurring on the clock falling edge. The initial conditions are as follows:

1. The address of the first row containing the first pel of the screen is loaded into the secondary address register. This address, along with a chip select signal $\overline{RAS}$, and a load master row buffer, $\overline{LMR}$, are used to place the first line into the master portion of the row buffer with the timing shown in FIG. 4.

2. A $\overline{LSR}$ signal is then applied to load the master into the slave portion of the row buffer. When this is completed, the data for the first 16 pels will be available at the secondary output ports from the push-pull drivers. The LSR signal is also used as an enable on the secondary port controller to permit the incrementing of the x address and reloading of the master via the $\overline{LMR}$ signal; however, the slave is not loaded at this time.

3. All counters off-chip must be initialized to C1=0, C2=0, and C3=0. When this is completed, the CRT master clock, CL, is started. The secondary port is then free running and controlled by clock CL.

The 4-bit, 16-position counter, C1, counts the 16 positions of the CRT register and thus controls filling and shifting of this register. The 6-bit, 64-position counter, C2, in combination with C1 counts the 1024 pels per scan line. Alternatively, one 10-bit counter running directly off CL could be used instead. Thus, this combination is used to trigger the horizontal flyback of the CRT when the 1024 pels of each scan line are refreshed. The 2-bit, 4-position counter, C3, in combination with C1 and C2 counts the 4096 bits stored in the 256 bit row buffers on the 16 DRAM chips. Thus, this combination is used to control the filling of the row buffer master and slave shift register.

Since C1 is initially 0, as CL comes up AND gate A2 will open and load the first 16 pels, one from each chip, into the master portion $M_n$ of the high-speed CRT register. AND gate A4 will be off thus preventing shifting in the register. As CL comes down and $\overline{CL}$ goes high (see FIG. 4), the master portion of the CRT register, $M_n$, will be loaded into the slave portion, and the first pel signal will be available very shortly after CL goes high. If relatively standard TTL chips are used, the CL pulse need not be supplied externally but may instead be generated internally. However, the timing remains the same as shown with the slaves being loaded from the master during the CL fall time with a very small delay.

Clock CL also causes C1 to increment its count by 1 in a typical master/slave fashion. On each subsequent CL period, A2 stays off while A4 turns on, thus shifting the CRT register but not loading any data. In addition, when C1 equals 2 or greater, the row buffer receives one shift pulse, CSR, which shifts it one position thereby making the next 16 pel signals available at the secondary output port. However, these are not latched into the CRT register until C1 reaches 0 once again. When this does happen, the 16 pels are loaded back to back with the last bit of the previous 16 so no clock cycles are lost and with no special timing interrupts. This is the advantage of a master/slave design throughput.

The first load of the 256 bit row buffer on the 16 chips gives a total of 16×256=4096 pels, which is equivalent to four scan lines on the CRT. Hence, when 64 bits have been read out of each of the 16 row buffers, the free running process must be temporarily halted to allow for horizontal flyback. This is done by counter C2 which counts 64 cycles of C1, i.e., increments when C1=0, and inhibits the CRT clock CL for sufficient time to allow flyback. The CL is allowed to run again, providing pels for the next scan line. When all 256 bits have been read out of the row buffers, only four scan lines will have been refreshed on the CRT screen. To provide a continuous flow of refresh data to the CRT, it is only necessary that the push-pull driver on the output of the slave portion of the row buffer have the new data after the flyback following the fourth scan line. This provides a very long time interval over which the master portion of the row buffer can be loaded, namely 256×15 CL cycles. The slave portion of the row buffer cannot be loaded until the last bit is read out of the CRT register. Hoever, this still gives 16 CL cycles (224 ns.) plus flyback time to issue an LSR signal and have the data latched and valid in the slave portion of the row buffer.

The method by which the master portion of the row buffer is loaded can be done in many ways. One simple way is to just load it on the next memory cycle after the slave has been loaded with the previous data. While this prevents the remainder of the system from accessing the bit buffer for an explicit cycle, it nevertheless insures that the loading is completed. This is done with counter C3 in FIG. 3. An alternative to this procedure is to allow the master to be loaded any time there is an unused memory cycle during this interval. However, the system designer must provide the necessary logic to test for an unused memory cycle, and if none occurs during this interval, then the memory cycle must be stolen in sufficient time to prevent loss of synchronization.

The method of implementing the counters in FIG. 3 requires that special attention be paid to the initial conditions and subsequent coincidence of the various "count" pulses. Any counter position is incremented by 1 on the falling edge of the input clock pulse. If C1 is initially set to 0 at start-up, there will be a positive signal of C1=0 into counter C2. When the very first CL pulse goes high and falls, the trailing edge will cause the signal C1=0 to also fall to 0. Since this latter is the clock pulse on C2, this counter will be incremented by 1. If C2 has a count of say decimal 63 (all six positions are 1), then this incoming pulse of C1=0 will not set C2=0 until the falling edge or slightly thereafter. Hence, at the moment C2 is set to 0, C1 is set to 1. If a coincidence of pulses (C1=0)*(C2=0) is needed to trigger flyback, this will not occur until C1 cycles back to 0 once again. Thus, C2 counts the beginning of a group of 16 bits out of the CRT register. The conclusion is that C2 should be initialized to 0 and allowed to increment by 1 on the very first CL pulse. C2 will subsequently reach a count of 0 at the beginning of the 64th group of 16 bits in the CRT register, and C1 will reach 0 at the end of this group being shifted to the screen. This is the correct time for flyback to be triggered by AND gate A5.

In a similar manner, counter C3 should be initialized to 0 and allowed to increment on the very first CL pulse. It is then counting the beginning of the scan line, i.e., count of 1 in C3 means the first scan line has started and is in process. The count will remain high until a C2=0 pulse is generated and falls. Hence, a coincidence of (C3=64)*(C2=0) in AND gate A6 occurs when the last of the 256 bits of the row buffer of each of the chips is about to be gated into the CRT register. Thus, it is time to activate $\overline{LSR}$ and then the secondary port controller to reload the master part of the row buffer.

The vertical flyback is not shown since that would be done in a very conventional manner. Normal incrementing of the 8-bit word address and counters would automatically reset these to 0 and allow the cycle to repeat. While there are many other ways in which the off-chip functions can be performed, this example shows the important timing considerations, pointing out the fact that the organization of the chip avoids any critical timing and allowing the system designer numerous options.

Figure 5B:
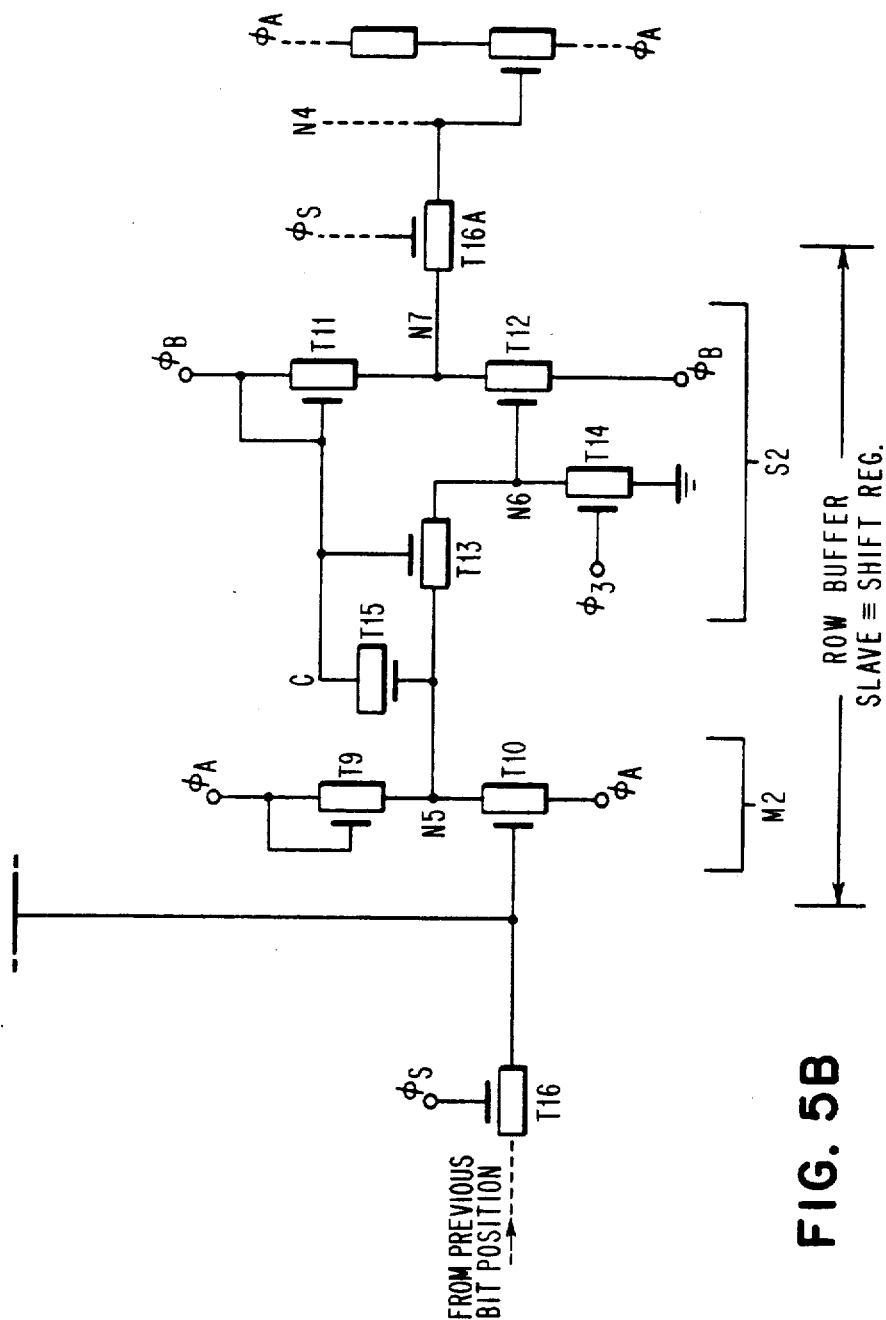
Figure 7:
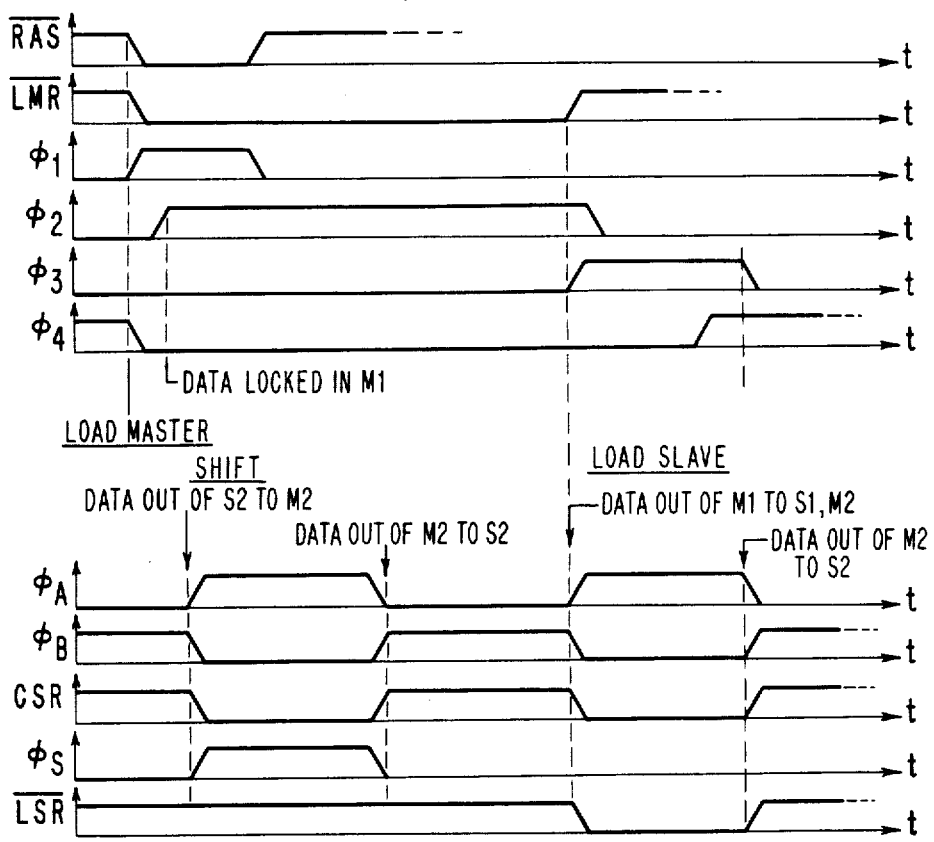
FIG. 7 is a timing diagram for the load master, load slave and shift operations.

The circuit schematic for one bit of the row buffer is shown in FIG. 5. The circuit essentially consists of two latches for M1 and S1, a two-phase shift register for M2 and S2 and some control gates. The latch M1 includes field effect transistor (FET) devices T1 and T1A coupled to the bit sense lines of the memory array by FET devices T0 and T0A. The latch S1 includes cross-coupled FET devices T6 and T6A coupled to the output of latch M1 by FET devices T5 and T5A. When $\phi 4$ (see FIG. 7) is high, nodes N1 and N1A are equalized to the $V_{dd}$ level. This causes both FET devices T5 and T5A to be on. Since $\phi 3$ is 0 at this time as shown in FIG. 7, both nodes N3 and N3A are at ground so no power is dissipated by slave S1. After the sense amplifier in the memory array is settled, $\phi 1$ will rise to transfer one of the bits in a particular word line to nodes N1 and N1A. The internal clock $\phi 2$ will rise pulling down node N2 to latch in and hold the data in the first latch M1. In order for the information in the first latch to be fed into the slave S1, $\phi 3$ must rise. This occurs when LSR becomes valid. Either nodes N3A or N3 will be self-bootstrapped to cause node N4 to be either charged to $V_{dd}-V_T$ or discharged to ground respectively. This voltage at node N4 is the input to the shift register. $\phi A$ and $\phi B$ are complementary non-overlapped clocks. Data is fed in at the fall of the $\phi A$ and will appear at node N7 at the fall of $\phi B$. The shift register is a two phase dynamic design with a bootstrapped capacitor added to eliminate the problem of charge sharing between nodes N5 and N6. If node N4 is high, node N5 will be low and stay low after the fall of $\phi A$. Node N6 will also be low and thus node N7 is high after the fall of $\phi B$. However, when node N4 is low, node N5 will stay high after the fall of $\phi A$. As soon as $\phi B$ rises, node N5 will be boosted high, charging node N6 to $V_{dd}-V_T$ independent of the capacitance at nodes N5 or N6. Therefore, when φB falls, node N7 will be discharged to ground.

This circuit has certain unique features. First note that the data in the row buffer master portion is held in M1. When data is passed to the row buffer slave, M2, it only passes momentarily through the S1 cross-coupled latch T6/T6A. This latch acts more as an amplifier to quickly respond to the differential signal between nodes N3 and N3A. In some circuits, the data is held in the slave portion, e.g. S1, and would be gated out to node N4 with a clock pulse when needed. However, for this dynamic design, this would require a more complex circuit or another FET in series with the output. The latter would introduce additional $V_T$ drop which must be avoided for high speed and good operating margins. This circuit achieves all these with a very simple design. One limitation is that the row buffer master cannot be loaded at the same time that the previous data is loaded into the row buffer slave. However, this is of no consequence for the intended application. The exact timing relationship between $\overline{LMR}$ and $\overline{LSR}$ is described later.

Some additional operational aspects of this circuit are as follows. In order to load the row buffer slave, LSR goes valid (low, see FIG. 7) and φ3 rises, which bootstraps node N3 or N3A to give a strong signal. If node N3A is positive, then a strong positive charge is stored on node N4 which is the input to the shift register. In principle, φ3 can now go to 0 and node N4 will hold its state because whichever device, T5 or T5A, was previously on will stay on and ground node N3 or N3A, whichever was previously high. Now both will be grounded which lets node N4 float with no path to ground. So it stays where it was.

The basic flow of data during typical operation is as follows. Data from 512 registers can be loaded in parallel into the M2 registers via 512 nodes N4. Once this is done, the data within the chain of M2-S2 can be shifted. For this to happen, devices T7 and T8 must both be off to allow node N4 to take on whatever charge is provided from the previous S2 stage out of devices T16 or T16A.

Figure 6:
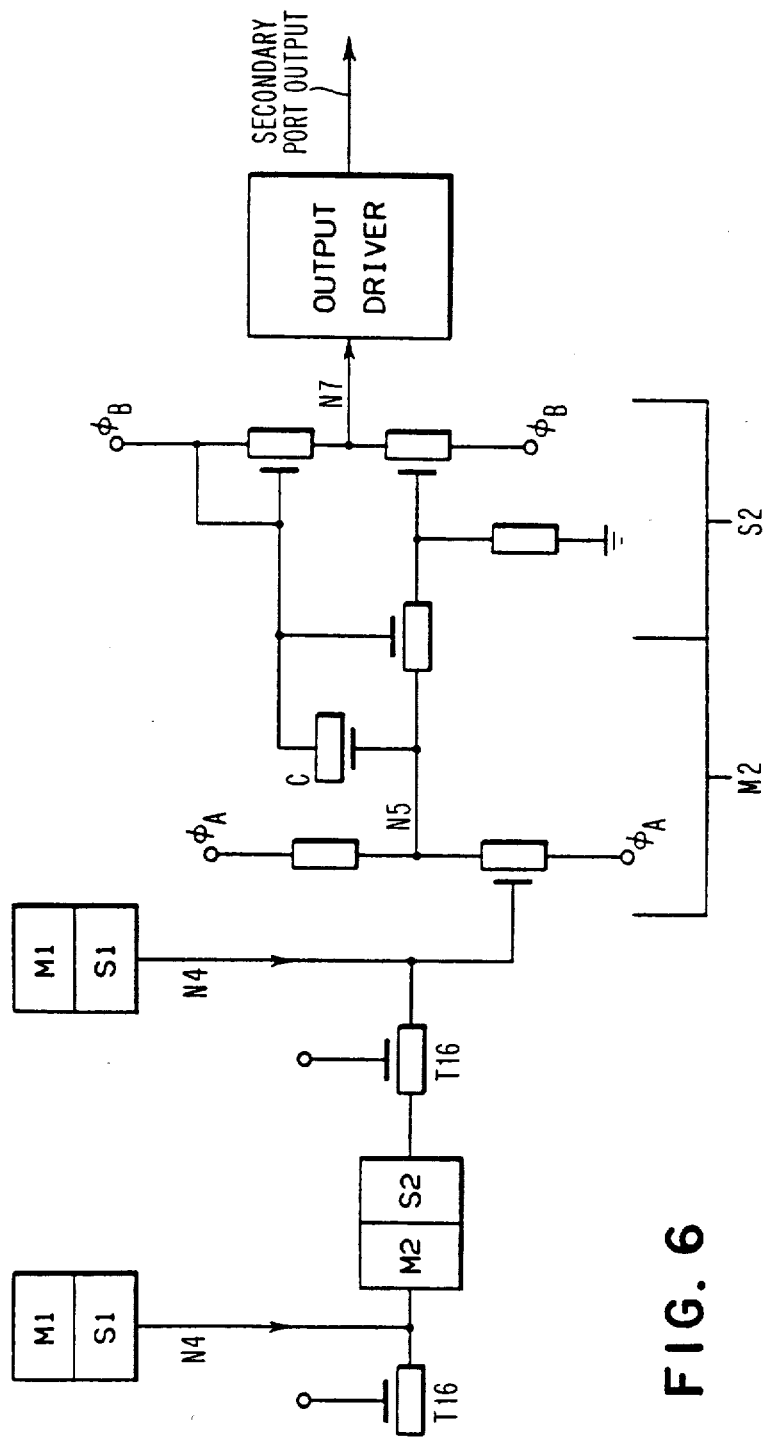
FIG. 6 is a schematic diagram of several bits and the output stage of the row buffer.

The load master register, $\overline{LMR}$, signal causes the data on the bit/sense line to latch into M1, the top part of the master row buffer. If this is done while the shift register is still shifting out previous data, then this new data cannot be loaded into S1 since this would hold node N4 in some fixed state, which is the input terminal to the shift register bits. Hence, when data is to be loaded into the shift register without missing a cycle, this new data is loaded from M1 to S1 while the previous state of M2 is shifting into S2. While all outputs from all S2 stages will be trying to force the state of the M2 of a subsequent stage at nodes N4, the isolating devices T16 are all off and prevent this at all shift register positions except the output driver stage which does not have a T16 isolator, as shown in FIG. 6. Thus, the last bit of the shift register is loaded into the output driver while new data is loaded from M1 to S1 and node N4. The output driver may be either a push-pull or a tri-state driver depending on the application. The use of a tri-state driver would allow dot-ORing the outputs of two or more registers. A separate additional output enable sigle for the tri-state drive would be necessary.

The various clocks required for this circuit to work are all generated from the three externally applied signals load master row buffer, $\overline{LMR}$, load slave row buffer, $\overline{LSR}$, and shift clock, CSR. In typical cases, CSR will be a continuously running clock which attempts to shift the slave row buffer on every cycle and can run totally asynchronously (see FIG. 6). Moreover, the shift clock can be changed on the fly to match the output device driven by the row buffer. In order to load the slave row buffer from the master row buffer, this clock must be logically ANDed with other signals to turn devices T16 off at the appropriate time.

In principle, the LMR signal can be applied at any time. When working with a dynamic chip as intended here, the LMR signal should become valid ($\overline{LMR}$ goes from +V to 0) at the same time as the $\overline{RAS}$ strobe signal falls (becomes valid). As indicated in FIG. 7, $\overline{LMR}*\overline{RAS}$ controls φ1, φ2 and φ4. $\overline{LSR}$ controls φ3 and φS, but obviously must be synchronized with CSR, the separately controlled shift clock. CSR in turn controls φA and φB. The timing for a load master buffer $\overline{LMR}$ is shown at the top of FIG. 7. When $\overline{LMR}*\overline{RAS}$ goes low, φ4 goes low and φ1 goes high to gate the data from the bit line into M1. Subsequently, φ2 goes high to latch the data in M1. When $\overline{RAS}$ goes high (invalid), then φ1 comes down to isolate the row buffer from the primary port. As long as $\overline{LMR}$ remains low, the data will remain latched in M1 and the array can be accessed through the primary port with $\overline{RAS}$ and $\overline{CAS}$ strobe signals. Clock φ1 will remain off since it cannot turn on until $\overline{LMR}$ goes high to restore that clock circuit. This circuit is not shown but is a standard clock circuit with restore. When $\overline{LMR}$ goes high (invalid), φ2 and φ4 will be restored to previous levels which destroys the data stored in the latch T1-T1A. Thus, if this data is to be preserved and transferred to the shift register, the $\overline{LSR}$ signal must become valid just before LMR becomes invalid. This loading of the slave row buffer is illustrated by the right hand sequence of pulses in FIG. 7. The $\overline{LSR}$ signal is externally synchronized to the shifting clock $\overline{CSR}$ as described with reference to the application shown in FIG. 3. When $\overline{LSR}$ goes low (valid) simultaneously with $\overline{CSR}$ going low, φA will rise and φB falls, while φS remains at 0. The latter signal holds all T16 devices off so no shifting can occur. The falling φB reads the last bit of data out of the right most S2 into the output driver in FIG. 6. Simultaneous with this, the rising φ3 and φA read the data out of M1 and S1 and subsequently into node N4. When φA falls some time later the data which was in M1 will be stored on the gate of T15 (the bootstrap capacitor). Thus, the data from the row buffer master is now in the slave and can be serially shifted. This shifting action can take place independently and simulatneously with $\overline{LMR}$, as shown by the lower left sequences of pulses in FIG. 7. In this case, $\overline{LSR}$ remains invalid which lets φS go high simultaneously with $\overline{CSR}$ going low (valid). This opens all gates T16 and lets data for all S2 stages spill into all subsequent M2 stages as φA also goes high. When φA and φS go low, with $\overline{CSR}$ going high, the data on the gates of all devices T10 are transferred to the gates of the bootstrap capacitor T15. While this was happening, φB was reading the state of the gates of all devices T12 and transferring that to the output when φB goes low.

It is important that when φB first falls to read out the previous data at node N6 to the output driver of the right most stage, the start of φ3 rising on device T14 must be delayed until the data is valid and used. Then φ3 must rise to remove any charge on node N6 in preparation for the next data cycle when φB rises again. If φ3 does not totally discharge node N6, then if the next data is "no charge", there is no way to remove this leftover charge. Consequently, node N6 can be in an indeterminate state. The correct sequence of pulses is easily achieved by internal timing delays.

While there are essentially only two clocks, $\phi A$ and $\phi B$, which drive the shift register, there are actually four clocking sequences. These sequences occur on the rising and falling edges of these two clocks. Rising $\phi A$ only precharges node N5 positive while the correct charge is accumulating at the gate of FET device T10 (either + or 0 charge). At the same time, $\phi B$ is rising and precharging node N7 high for preparation of the next charge transfer cycle. So $\phi A$ is precharging node N5 while $\phi B$ is reading the state of its input at node N6; likewise, when $\phi B$ is precharging node N7 high, $\phi A$ is reading the state of its input at node N4.

Thus, a very fast, relatively simple and highly functional, dynamic row buffer circuit is achieved. Such a circuit can easily be incorporated into any dynamic memory chip which uses folded bit sense lines, or has other simple means for tapping the signal on all sense latches. A modification of the basic circuit may be made by adding a one out of n (1/256 in the specific example disclosed) decoder parallel to the slave register so that a fully decoded output could be made available as an output. Other modifications may be made to the invention by those skilled in the art without departing from the scope of the appended claims.

We claim:

1. A dynamic row buffer circuit for a dynamic random access memory chip which enables the dynamic random access memory chip to be used for special function applications comprising a row buffer master register and a row buffer slave register, said row buffer master register comprising a plurality of first master circuits and a plurality of first slave circuits, said row buffer slave register comprising a plurality of second master circuits and a plurality of second slave circuits, said first master circuits being connected to bit sense amplifiers of the memory array and the outputs of said first master circuits being connected to the inputs of said first slave circuits to permit parallel data transfer from the memory array to said first master circuits and then to said first slave circuits, the inputs of said second master circuits being connected to the outputs of said first slave circuits and said second slave circuits being serially connected in an alternating sequence of second master and second slave circuits to permit parallel data transfer from said first slave circuits to said second master circuits and then serial data transfer in said row buffer slave register.

2. The dynamic row buffer circuit as recited in claim 1 wherein said dynamic random access memory chip includes a primary input/output port and further includes a secondary output port, said dynamic row buffer further comprising a secondary output port driver circuit connected between the slave circuit in the last stage of said row buffer slave register and said secondary output port.

3. The dynamic row buffer circuit as recited in claim 2 wherein said output port driver circuit is a push-pull driver circuit.

4. The dynamic row buffer circuit as recited in claim 2 wherein said output port driver circuit is a tri-state driver circuit.

5. The dynamic row buffer circuit as recited in claim 2 wherein said dynamic random access memory chip includes a pin connected to the memory array for a row address strobe signal, said dynamic row buffer circuit further includes a pin connected to said row buffer master register for a load master register signal, a pin connected to said row buffer slave register for a load slave register signal, and another pin connected to said row buffer slave register for a shift register clock signal.

6. The dynamic row buffer circuit as recited in claim 5 further comprising control means responsive to said row address strobe signal, said load master register signal, said load slave register signal and said shift register clock signal for generating signals which cause the parallel transfer of data from the memory array to said first master circuits and then to said first slave circuits and said second master circuits and then the serial shifting of data in said row buffer slave register to said secondary output port.

7. The dynamic row buffer circuit as recited in claim 1 wherein said first master circuits comprise first field effect transistor device latch circuits switchably connected to bit sense lines of the memory array and said first slave circuits comprise second field effect transistor device latch circuits switchably connected to the outputs of said first latch circuits.

8. The dynamic row buffer circuit as recited in claim 7 wherein said second master circuits comprise gated capacitive storage means for storing charges corresponding to bits transferred from said second latch circuits and said second slave circuits comprise field effect transistor circuits for transferring the charges stored on said capacitive storage means.

9. The dynamic row buffer circuit as recited in claim 8 further comprising clock means for generating oppositely phased clock signals which are supplied respectively to said second master and said second slave circuits to transfer charges stored by said capacitive storage means in said second master circuits to said second slave circuits and thence to said second master circuits in sequence thereby effecting the shifting of data in said row buffer slave register.

10. The dynamic row buffer circuit as recited in claim 9 wherein said clock means operates asynchronously with the operation of said memory array.

11. A method of operating a dynamic row buffer circuit for a dynamic random access memory chip, said row buffer circuit comprising a row buffer master register and a row buffer slave register, said row buffer master register comprising a plurality of first master circuits and a plurality of first slave circuits, said row buffer slave register comprising a plurality of second master circuits and a plurality of second slave circuits, said first master circuits being connected to bit sense amplifiers of the memory array and the outputs of said first master circuits being connected to the inputs of said first slave circuits to permit parallel data transfer from the memory array to said first master circuits and then to said first slave circuits, the inputs of said second master circuits being connected to the outputs of said first slave circuits and said second slave circuits being serially connected in an alternating sequence of second master and second slave circuits to permit parallel data transfer from said first slave circuits to said second master circuits and serial data transfer in said row buffer slave register, said dynamic random access memory chip including a primary input/output port and a secondary output port, said primary input/output port being connected to the memory array and an output port driver circuit being connected between the slave circuit in the last stage of said row buffer slave register and said secondary output port, said chip having a pin connected to the memory array for a row address strobe signal, a pin connected to said row buffer master register for a load master register signal, a pin connected to said row buffer slave register for a load slave register signal, and another pin connected to said row buffer slave register for a shift register clock signal, said method comprising the steps of generating a row address signal and a load master register signal to transfer in parallel addressed data from said bit sense amplifiers to said first master circuits and then to said first slave circuits, generating a load slave register signal to transfer in parallel the data in said first slave circuits to said second master circuits, and generating a shift register clock signal to shift the data in said slave register to said secondary output port.

12. The method as recited in claim 11 wherein the step of generating the shift register clock signal is performed asynchronously with the operation of said memory array.

13. The method as recited in claim 12 wherein the frequency of the shift register clock signal is changed to match an output device.

14. The method as recited in claim 12 wherein the step of generating a load slave register signal is performed immediately upon the last bit of data in said slave register being shifted into said secondary output port driver circuit so as to obtain a continuous stream of output data.

* * * * *